United States Patent [19]
Jeker et al.

[11] Patent Number: 5,744,959
[45] Date of Patent: Apr. 28, 1998

[54] NMR MEASUREMENT APPARATUS WITH PULSE TUBE COOLER

[75] Inventors: René Jeker, Hombrechtikon; Silvio Di Nardo, Zürich; Beat Mraz, Hombrechtikon, all of Switzerland

[73] Assignee: Spectrospin AG, Fällanden, Switzerland

[21] Appl. No.: 757,696

[22] Filed: Dec. 3, 1996

[30] Foreign Application Priority Data

Dec. 22, 1995 [DE] Germany .......................... 195 48 273.5

[51] Int. Cl.$^6$ ..................................................... G01V 3/00
[52] U.S. Cl. ........................................... 324/319; 62/51.1
[58] Field of Search .................................. 324/320, 319, 324/318, 314, 300; 62/6, 51.1; 335/296

[56] References Cited

U.S. PATENT DOCUMENTS

| | | | |
|---|---|---|---|
| 3,237,421 | 3/1966 | Gifford | 62/88 |
| 4,535,595 | 8/1985 | Keller et al. | 62/3 |
| 4,953,366 | 9/1990 | Swift et al. | 62/467 |
| 4,986,077 | 1/1991 | Saho et al. | 62/51.1 |
| 5,129,232 | 7/1992 | Minas et al. | 62/51.1 |
| 5,181,385 | 1/1993 | Saho et al. | 62/51.1 |
| 5,280,247 | 1/1994 | DeMeester et al. | 324/318 |
| 5,404,726 | 4/1995 | Janssen | 62/51.1 |

FOREIGN PATENT DOCUMENTS

| | | |
|---|---|---|
| 0116364 | 8/1984 | European Pat. Off. |
| 4020593 | 1/1991 | Germany |
| 4227388 | 2/1994 | Germany |

OTHER PUBLICATIONS

Advances in Cryogenic Engineering, vol. 31, 1986, pp. 517–532, R.C. Longworth: "4K Refrigerator and Interface for MRI Cryostats".

Cryogenics, vol. 34, 1994, pp. 155–158, Y. Matsubara, J. Gao: "Multi-Staged Pulse Tube Refrigerator for Superconducting Magnet Applications".

*Primary Examiner*—Louis M. Arana
*Attorney, Agent, or Firm*—Paul J. Vincent

[57] ABSTRACT

A NMR measurement apparatus comprising a cryostat (10) in which a superconducting magnet coil system (9) is disposed in a first tank (8) having cryogenic liquid and surrounded by additional cooling devices such as radiation shields (5, 6), superinsulating foil (7) and, if appropriate, a second tank (3) having cryogenic liquid, is characterized by a pulse tube cooler (11) cryotechnically connected to at least one of the additional cooling devices in a good heat conducting fashion with this cooling device being mechanically attached in the cryostat (10) in such a fashion that vibrational and cryotechnical decoupling is achieved between the cooling device and the first tank (8) having the cryogenic liquid and, in particular, between the cooling device and the superconducting magnet coil system (9). The cooling losses of the cryostat are minimized in the NMR measurement apparatus in accordance with the invention so that a nearly uninterrupted operation of the apparatus is facilitated with, however, no field distortions being produced by the cryogenic measures, which would be extremely undesirable, in particular, with a high resolution NMR spectrometer and which would have to be compensated for through extremely difficult technical measures.

11 Claims, 2 Drawing Sheets

NMR MEASUREMENT APPARATUS WITH PULSE TUBE COOLER

GROUND OF THE INVENTION

The invention concerns a nuclear magnetic resonance (NMR) measurement apparatus, in particular a high resolution NMR spectrometer, having a cryostat containing a superconducting magnet coil system, wherein the superconducting magnet coil system is disposed in a first tank having a cryogenic liquid and surrounded by additional cooling devices such as radiation shields, superinsulating foil and, if appropriate, a second tank having a cryogenic fluid.

A NMR measurement apparatus of this kind is, for example, known in the art from U.S. Pat. No. 4,535,595.

In the conventional apparatus, a superconducting NMR magnetic coil is disposed in a first tank, having liquid helium, inside a cryostat. Radiation shields and a second tank having liquid nitrogen are disposed around this first tank. A motor-driven refrigerator is located on the outer casing of the cryostat and cools one or a plurality of the radiation shields via a cooling arm passing through the outer casing.

Since it is necessary that the superconducting magnet coil for use in NMR measurements, in particular for high resolution NMR spectroscopy, produce an extremely homogeneous magnetic field, even the smallest of perturbations of the field are not permissable. Such perturbations are, however, in particular caused by moving components associated with the operation of the refrigerator. For this reason the apparatus associated with U.S. Pat. No. 4,535,595 provides for a sensing device to detect magnetic and/or mechanical perturbing signals emanating from the motor drive of the refrigerator, the device controlling at least one correction coil for compensation of the perturbing fields active in the sample region of the NMR measurement configuration caused by operation of the refrigerator.

Although it is thereby possible to largely compensate for the vibration related magnetic field perturbations caused by the refrigerator, this is only achieved in the conventional apparatus at great technical expense and requires, in particular, a series of additional coils as well as detector coils, sensing devices and a corresponding additional control electronics. For this reason the advantages which are associated with the utilization of the refrigerator, the corresponding reduced cooling losses and increase in the holding-time of the cryostat, are at least partially nullified from an economic and technical point of view.

It is therefore the purpose of the present invention to modify a NMR measurement apparatus having the above mentioned features in such a fashion that, the cryostat cooling losses are kept as small as possible to facilitate a nearly uninterrupted operation of the NMR superconducting magnet apparatus, while avoiding production of field perturbations by the cryotechnical means which would be extremely undesirable with a high resolution NMR spectrometer and which would have to be compensated for with great technical difficulty.

SUMMARY OF THE INVENTION

This purpose is achieved in accordance with the invention in a manner which is as surprisingly simple as it is effective in that a pulse tube cooler is provided for, cryotechnically connected with good heat conduction to at least one of the additional cooling devices with this cooling device being mechanically secured in the cryostat in such a fashion that vibration and cryotechnical decoupling is achieved between the cooling device and the first tank having cryogenic liquid and therefore between the cooling device and the superconducting magnet coil system.

The utilization of a pulse tube cooler instead of a mechanically functioning refrigerator, as is for example known in the art from the doctoral thesis of Jingtao Liang "Development and Experimental Verification of a Theoretical Model for Pulse Tube Refrigeration", Institute of Engineering Thermophysics, Chinese Academy of Sciences, 1993 as well as in the literature cited therein, results in the initial production of substantially less field perturbations, since this type of pulse tube cooler does not comprise mechanically moving metallic parts so that no eddy currents can be induced during operation which could encroach upon the field homogeneity in the measuring center of the NMR measurement apparatus. The pure mechanically transferred vibrations are also significantly reduced.

In addition to the pulse tube cooler which, in and of itself, comprises components which are very low in vibration, it is furthermore provided for in accordance with the invention that the additional cooling device disposed within the cryostat, to which the cold end of the pulse tube cooler is cryotechnically connected be vibrationally decoupled from the first tank of the cryostat containing the superconducting magnet coil system. In U.S. Pat. No. 5,404,726, the complete contents of which are hereby incorporated by reference, the possibilities associated with a mechnically flexible thermal coupling are extensively described.

In this fashion one fully guarantees that damaging vibrations are not transferred to the field producing system, wherein a degradation of the field homogeneity through the operation of the pulse tube cooler can be ruled-out. The technical difficulties associated therewith are negligibly small compared to the conventional solution as, for example, described in the above cited publication U.S. Pat. No. 4,535,595.

The inventive concept can also be realized with other non-NMR apparatus with which an effective cooling in a cryostat is required while unconditionally avoiding vibrations of arbitrary origin.

An embodiment of the NMR measurement apparatus in accordance with the invention provides for the pulse tube cooler being disposed spacially separated from the cryostat. In this fashion a transfer of the pulse tube cooler operation vibrations to the cryostat, which are in any event extremely small, is completely eliminated.

An embodiment is advantageous with which the pulse tube cooler is cryotechnically coupled to the additional cooling device by means of a flexible mechanical connection while being decoupled from same with respect to vibrations. In this fashion, in addition to the mechanical decoupling of the additional cooling device from the first tank, the propagation of structure-borne noise from the pulse tube cooler to the additional cooling device is eliminated from the outset.

Same is particularly advantageous in embodiments of the NMR device in accordance with the invention with which the pulse tube cooler is disposed directly on the outside of or arranged in the cryostat and connected to the cryostat housing in a mechanically rigid fashion. This can, for example, be necessary in order to save space when configuring the entire installation to be as compact as possible.

In most cases the NMR measurement device in accordance with the invention is supplied with liquid helium in the tank holding the superconducting magnet coil system to safely facilitate the superconductivity of the coil material.

In improvements of these embodiments a second tank with liquid or with solid nitrogen can be provided for as an additional cooling device which, for its part, thermally shields the first tank having the liquid helium and contributes to an increased prolongation of the holding-time of the cryostat.

In other embodiments of these inventions the first tank holding the superconducting magnet coil system is supplied with liquid or, in exceptional cases also possibly with solid nitrogen or with another cryogenic medium, wherein the superconducting magnet coil system must then comprise high temperature superconducting material. In this type of cryosystem the expensive liquid helium and the difficult cooling devices which are necessary in order to keep the helium in liquid form would no longer be necessary.

In embodiments of a NMR measurement apparatus in accordance with the invention it is possible for liquid or solid air, liquid or solid oxygen, liquid neon, liquid argon or another cryogenic medium to also be provided in the second tank, chosen in accordance with the special needs of the current experiment.

In further embodiments of the invention, the cold end of the pulse tube cooler can be connected in a cryotechnical fashion to the radiation shield surrounding the first tank. In this fashion either an additional tank having cryogenic fluid can be eliminated or at least the holding-time of the cryogenic fluid in the first tank can be substantially increased.

An additional improvement of the cooling behaviour is achieved in improvements in these embodiments when the radiation shield connected to the pulse tube cooler is additionally cooled by cryogenic media evaporating from the first tank. In this fashion the enthalpy contained in the cooling liquid can be more advantageously used.

An embodiment of the NMR measurement apparatus in accordance with the invention is particularly compact with which a tower is disposed on the upper side of the cryostat, wherein the pulse tube cooler is disposed in this tower.

Embodiments are possible with which the cold end of the pulse tube cooler is cryotechnically connected to the second tank containing an additional cryogenic liquid. In this fashion the holding-time of the cryogenic liquid in the second tank is substantially increased.

In additional advantageous embodiments, evaporation towers for evaporation of the cryogenic liquids from the first and the second tanks are provided for on the upper side of the cryostat.

A method for the operation of the NMR measurement apparatus in accordance with the invention is also within the framework of the invention, the apparatus having an additional cooling device comprising a second tank with a cryogenic medium which is sufficiently cooled during operation of the cryostat to be present in solid state. The cooling of the cryogenic medium below its freezing point is, for example, possible in accordance with the invention when the cold end of the pulse tube cooler is cryotechnically connected to the second tank. Furthermore, the cryogenic medium in the second tank must not absolutely have to be completely frozen, rather significant reductions in evaporation losses are already achieved when same is only partially frozen.

Further advantages of the invention can be extracted from the description and the drawing. The above mentioned features and those to be further described below in accordance with the invention can be utilized individually or collectively in arbitrary combination. The embodiments shown and described are not to be considered as exhaustive enumeration rather have exemplary character only for illustration of the invention. The invention is represented in the drawing and will be more closely described with reference to the embodiments.

DESCRIPTION OF THE PREFERRED EMBODIMENT

Figure 1:
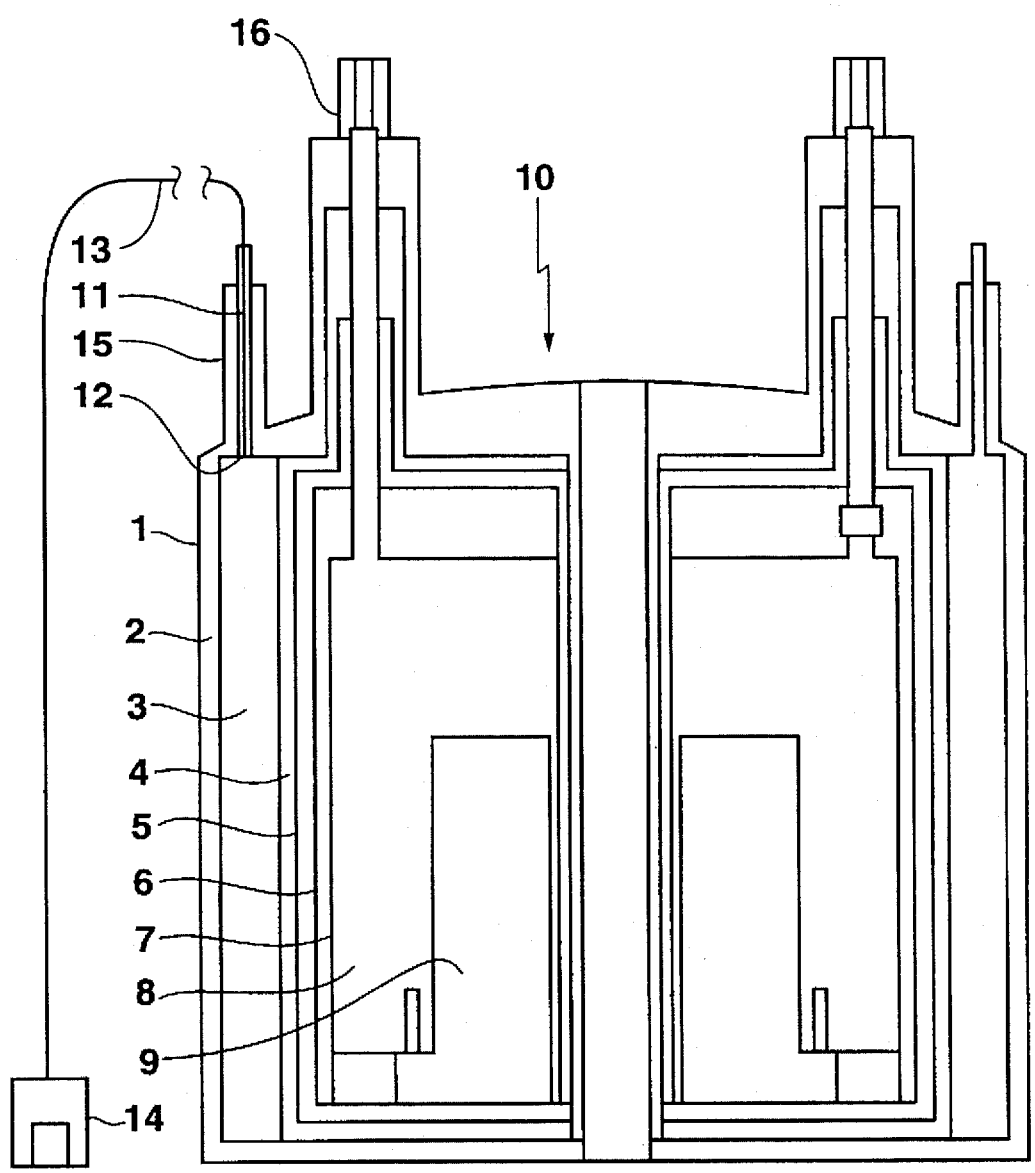
FIG. 1 shows a schematic side view of a longitudinal cut through the cryostat of a NMR measurement apparatus in accordance with the invention having a pulse tube cooler.

FIG. 1 shows a cryostat designated with reference symbol 10 which has, within a croystat housing 1 as seen from the outside towards the inside, a vacuum portion 2, a nitrogen tank 3, two radiation shields 5 and 6 in an additional vacuum portion 4, a superinsulation 7 surrounding a helium tank 8, as well as a superconducting magnet system 9 in the helium tank 8 and cooled by the surrounding liquid helium. A pulse tube cooler 11 is disposed in a tower 15, leading outwardly from the nitrogen tank 3, the cold end of the pulse tube cooler 11 being connected to the nitrogen tank 3. In this fashion the pulse tube cooler 11 can be cryotechnically connected to the liquid nitrogen in the second tank 2, while being rigidly mechanically attached to the cryostat housing 1.

The "warm" end of the pulse tube cooler 11 is connected to a pressure generator 14 by means of a flexible hose connection 13, the pressure generator 14 producing pressure necessary for the operation of the pulse tube cooler 11 and transferring same via the hose connection 13 to the pulse tube cooler 11.

The first tank 8 filled with liquid helium and containing the superconducting magnet coil system 9 is suspended in the helium evaporation towers 16. The nitrogen tank 3 is likewise suspended in the nitrogen evaporation towers so that the nitrogen tank 3 is vibrationally decoupled from the helium tank 8.

Instead of liquid helium, it is also possible for liquid nitrogen to surround the coil system 9 in the first tank 8, in the event that the coil system 9 comprises high temperature superconducting material. In this case the nitrogen in the first tank 8 is, for example, frozen through use of a refrigerator, but remains liquid in the second tank 3, although a freezing of the nitrogen with the assistance of the pulse tube cooler 11 is also conceivable here.

Instead of liquid nitrogen, other liquid or solid croygenic media can be utilized in the second tank 3 depending on the current experimental needs; for example, air, oxygen, neon or argon.

Figure 2:
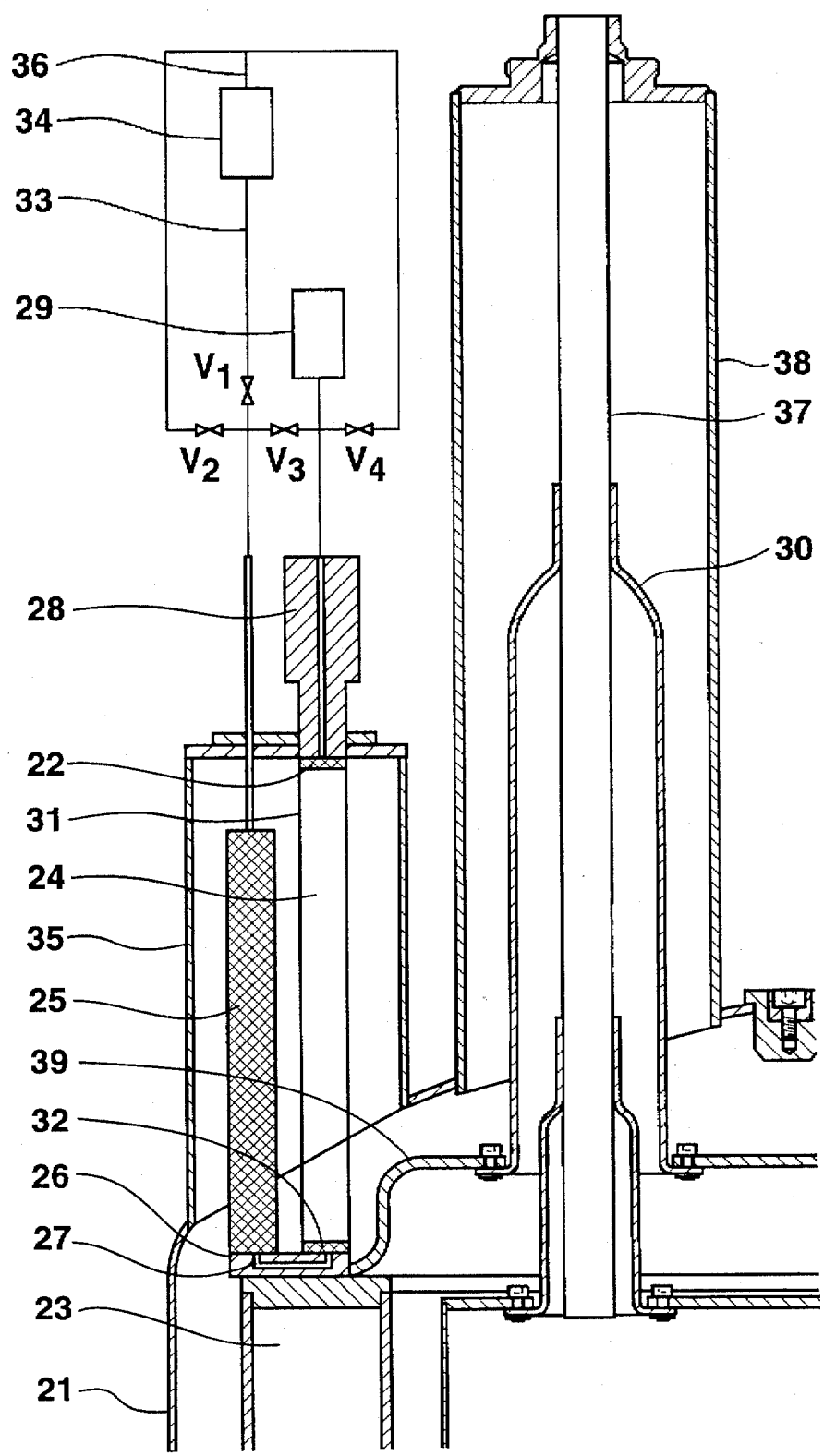
FIG. 2 shows a schematic detail-view of a longitudinal cut through a cryostat having a pulse tube cooler connected thereto in accordance with the invention.

FIG. 2 shows a schematic cut detail-view of the cryostat shown in FIG. 1. A functional sketch of the pulse tube cooler 31 is shown in the upper left half of FIG. 2, same being partially accommodated in a tower 35 within the croystat housing 21. The warm end 22 of the pulse tube cooler 31 is thereby coupled to a heat exchanger 28 located at room temperature, whereas the cold end 32 is cryogenically coupled by means of a contact element 26 to a nitrogen tank 23 inside the cryostat. The pulse tube 24 extends between the warm end 22 and the cold end 32. The cross-hatched region in the vicinity of both ends 22 and 32 indicates a heat exchanging material filling, for example steel wool, a copper grid or the like.

A pulse tube 24 is connected to a refrigerator 25 via a connecting lead 27 through the contact element 26 for heat exchange of the cryogenic gas with which the pulse tube cooler 31 is operated.

A compressor 34 is provided for the production of pressure waves in the cryogenic gas of the pulse tube cooler 31, the compressor 34 supplying a high pressure lead 33 with approximately 30 bar and a low pressure lead 36 with approximately 7 bar. Pressure waves are produced by appropriate control of valves V1, V2, V3 and V4 in such a fashion, that the shock waves are formed in the pulse tube 24 of the pulse tube cooler 31. A buffer volume 29 thereby serves as a frequency adjustment.

A radiation shield 39 is coupled in a mechanically flexible but thermically good-conducting fashion to the evaporation tube 37 in a helium evaporation tower 38 by means of a spirally shaped slotted coupling element 30 in order to avoid vibration transfer to the NMR magnet system located in the inside of a helium tank (not shown in FIG. 2) within the cryostat. In this fashion the enthalpy of the evaporating helium is also optimally utilized for additional cooling of the radiation shield 39 while assuring that vibrations and thereby field perturbations are not transferred to the magnet system. A precise description of possible embodiments of the coupling element 30 can be extracted from U.S. Pat. No. 5,404,726, the entire contents of which is hereby incorporated by reference.

In order to extend the holding-time of the cryostat it is possible for the nitrogen in the nitrogen tank to be sufficiently cooled to be present during operation in the solid state.

In embodiments not shown it is also possible for the nitrogen tank to be completely eliminated with only one radiation shield surrounding the helium tank being cooled with the pulse tube cooler in accordance with the invention.

We claim:

1. A high resolution nuclear magnetic resonance (NMR) measurement apparatus comprising:

a low loss cryostat;

a first tank disposed inside said cryostat, said first tank for containing cryogenic liquid;

a superconducting magnetic coil system disposed in said first tank for cooling by said cryogenic liquid, said superconducting magnet coil producing an extremely homogeneous magnet field for high resolution NMR spectroscopy;

a second tank disposed inside said cryostat and surrounding said first tank, said second tank mechanically mounted in said cryostat to vibrationally and cryogenically decouple said second tank from said first tank and from said superconducting magnet coil system, said second tank containing at least one of liquid nitrogen, said nitrogen, liquid air, solid air, liquid oxygen, solid oxygen, liquid neon and liquid argon; and a pulse tube cooler having a cold end cryogenically thermally coupled to said second tank.

2. The NMR measurement apparatus of claim 1, wherein said pulse tube cooler is disposed at a spatial separation from said cryostat.

3. The NMR measurement apparatus of claim 1, further comprising a mechanically flexible connection between said pulse tube cooler and said second tank to cryogenically couple and vibrationally decouple said pulse tube cooler to said second tank.

4. The NMR measurement apparatus of claim 3, wherein said pulse tube cooler is rigidly mounted directly to said cryostat.

5. The NMR measurement apparatus of claim 1, wherein said first tank contains liquid helium.

6. The NMR measurement apparatus of claim 1, wherein said superconducting magnet coil system comprises high temperature superconducting material.

7. The NMR apparatus of claim 1, further comprising a radiation shield, wherein a cold end of said pulse tube cooler is cryogenically connected to said radiation shield.

8. The NMR measurement apparatus of claim 7, wherein said radiation shield is disposed for additional cooling by evaporating cryogenic media.

9. The NMR measurement apparatus of claim 1, wherein said cryostat comprises a tower on an upper side thereof, and wherein said pulse tube cooler is disposed within said tower.

10. The NMR measurement apparatus of claim 1, wherein said cryostat comprises an evaporation tower on an upper side thereof for evaporation of said cryogenic liquid.

11. A method for operation of an NMR apparatus, the apparatus comprising a low loss cryostat; a first tank disposed inside said cryostat, said first tank for containing cryogenic liquid; a superconducting magnetic coil system disposed in said first tank for cooling by said cryogenic liquid, said superconducting magnet system producing an extremely homogeneous magnetic field for high resolution NMR spectroscopy; additional cooling means having a second tank containing liquid or solid nitrogen and disposed inside said cryostat surrounding said first tank, said additional cooling means mechanically mounted in said cryostat to vibrationally and cryogenically decouple said additional cooling means from said first tank and from said superconducting magnet coil system; and a pulse tube cooler cryogenically thermally coupled to said additional cooling means, the method comprising the step of cooling said liquid nitrogen in said second tank during operation of said apparatus to form solid nitrogen.

* * * * *